United States Patent
Feng et al.

(10) Patent No.: US 11,830,408 B2
(45) Date of Patent: Nov. 28, 2023

(54) SHIFT REGISTER UNIT AND METHOD OF DRIVING THE SAME, GATE DRIVING CIRCUIT, AND DISPLAY DEVICE

(71) Applicants: Hefei BOE Joint Technology Co., Ltd., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 17/419,409

(22) PCT Filed: Oct. 30, 2020

(86) PCT No.: PCT/CN2020/125345
§ 371 (c)(1),
(2) Date: Jun. 29, 2021

(87) PCT Pub. No.: WO2021/093609
PCT Pub. Date: May 20, 2021

(65) Prior Publication Data
US 2022/0076609 A1     Mar. 10, 2022

(30) Foreign Application Priority Data
Nov. 11, 2019 (CN) .......................... 201911097965.6

(51) Int. Cl.
*G09G 3/20* (2006.01)
*G09G 3/36* (2006.01)
*G11C 19/28* (2006.01)

(52) U.S. Cl.
CPC .... *G09G 3/2092* (2013.01); *G09G 2310/0286* (2013.01); *G09G 2310/061* (2013.01); *G09G 2310/08* (2013.01); *G11C 19/28* (2013.01)

(58) Field of Classification Search
CPC ......... G09G 3/2092; G09G 2310/0286; G09G 2310/061; G09G 2310/08; G11C 19/28
See application file for complete search history.

(56) References Cited

U.S. PATENT DOCUMENTS 9,343,178 B2  5/2016  Chan et al.
9,418,755 B2  8/2016  So et al.
(Continued)

FOREIGN PATENT DOCUMENTS

CN   103854585 A   6/2014
CN   104112421 A   10/2014
(Continued)

*Primary Examiner* — Lin Li
(74) *Attorney, Agent, or Firm* — Westman, Champlin & Koehler, P.A.

(57) ABSTRACT

A shift register unit and a method of driving the shift register unit, a gate driving circuit, and a display device. The shift register unit includes: a first shift register configured to generate a first control output signal (CR1) and a second control output signal (CR2) based on a signal at a first clock signal terminal (CLKD); and a second shift register configured to generate a second output signal (OUT2) based on a signal at a third clock signal terminal (CLKE2), wherein a first pull-down node (PD1_1) of the first shift register is connected to a second pull-down node (PD2_2) of the second shift register, and a second pull-down node (PD1_2) of the first shift register is connected to a first pull-down node (PD2_1) of the second shift register.

12 Claims, 11 Drawing Sheets

(56) References Cited

U.S. PATENT DOCUMENTS

| | | | |
|---|---|---|---|
| 2002/0044625 A1 | 4/2002 | Kim et al. | |
| 2014/0152629 A1 | 6/2014 | So et al. | |
| 2015/0294734 A1 | 10/2015 | Chan et al. | |
| 2017/0309211 A1* | 10/2017 | Zhang | G09G 3/007 |
| 2019/0108809 A1* | 4/2019 | Zheng | G11C 19/287 |
| 2021/0358365 A1* | 11/2021 | Feng | G11C 19/287 |
| 2021/0358383 A1* | 11/2021 | Hu | G09G 3/2092 |

FOREIGN PATENT DOCUMENTS

| | | | | |
|---|---|---|---|---|
| CN | 104700789 A | | 6/2015 | |
| CN | 106157912 A | * | 11/2016 | G09G 3/3677 |
| CN | 107452350 A | * | 12/2017 | G11C 19/28 |
| CN | 110767256 A | | 2/2020 | |
| CN | 210925502 U | | 7/2020 | |

\* cited by examiner

A first input signal is applied to a first input signal terminal, a first clock signal is applied to a first clock signal terminal, and a second clock signal is applied to a second clock signal terminal, such that the first shift register may input a signal at the first input signal terminal to a pull-up node of the first shift register, and under control of potentials of the pull-up node, a first pull-down node and a second pull-down node of the first shift register, generate a first control output signal and a second control output signal based on a signal at the first clock signal terminal and provide the first control output signal and the second control output signal respectively to a first control output signal terminal and a second control output signal terminal, and generate a first output signal based on a signal at the second clock signal terminal and provide the first output signal to a first output signal terminal
— S101

A second input signal is applied to a second input signal terminal and a third clock signal is applied to a third clock signal terminal, such that a second shift register may transmit a signal at a second input signal terminal to a pull-up node of the second shift register, and under control of potentials of the pull-up node, a first pull-down node and a second pull-down node of the second shift register, generate a second output signal based on a signal of a third clock signal terminal and provide the second output signal to a second output signal terminal
— S102

FIG. 6

SHIFT REGISTER UNIT AND METHOD OF DRIVING THE SAME, GATE DRIVING CIRCUIT, AND DISPLAY DEVICE

CROSS REFERENCE TO RELATED APPLICATION(S)

This application is a Section 371 National Stage Application of International Application No. PCT/CN2020/125345, filed on Oct. 30, 2020, entitled "SHIFT REGISTER UNIT AND METHOD OF DRIVING THE SAME, GATE DRIVING CIRCUIT, AND DISPLAY DEVICE", which published as WO 2021/093609 A1, on May 20, 2021, which claims priority to Chinese Patent Application No. 201911097965.6, filed on Nov. 11, 2019, the contents of which are incorporated herein by reference in their entireties.

TECHNICAL FIELD

The present disclosure relates to a field of display technology, and in particular to a shift register unit and a method of driving a shift register unit, a gate driving circuit, and a display device.

BACKGROUND

In the field of display technology, especially in an OLED display device, Gate Driver On Array (GOA) technology is widely used because it may reduce panel defects and costs. In the GOA technology, multi-stage driving signals are generated by a plurality of shift registers cascaded, so as to drive pixel rows on a panel. For a GOA circuit, how to reduce its occupied space to achieve a narrow frame has attracted more and more attention.

SUMMARY

According to an aspect of the present disclosure, there is provided a shift register unit, including:
a first shift register including a pull-up node, a first pull-down node and a second pull-down node, wherein the first shift register is configured to: input a signal at a first input signal terminal to the pull-up node of the first shift register, and, under control of potentials of the pull-up node, the first pull-down node and the second pull-down node of the first shift register, generate a first control output signal and a second control output signal based on a signal at a first clock signal terminal and provide the first control output signal and the second control output signal respectively to a first control output signal terminal and a second control output signal terminal, and generate a first output signal based on a signal at a second clock signal terminal and provide the first output signal to a first output signal terminal; and
a second shift register including a pull-up node, a first pull-down node and a second pull-down node, wherein the second shift register is configured to: transmit a signal at a second input signal terminal to the pull-up node of the second shift register, and, under control of potentials of the pull-up node, the first pull-down node and the second pull-down node of the second shift register, generate a second output signal based on a signal at a third clock signal terminal and provide the second output signal to a second output signal terminal;
wherein the first pull-down node of the first shift register is connected to the second pull-down node of the second shift register, and the second pull-down node of the first shift register is connected to the first pull-down node of the second shift register.

For example, the first shift register includes:
a first input circuit connected to the first input signal terminal and the pull-up node of the first shift register, wherein the first input circuit is configured to input the signal at the first input signal terminal to the pull-up node of the first shift register;
a first control circuit connected to the pull-up node of the first shift register and the first pull-down node of the first shift register, wherein the first control circuit is configured to control the potential of the first pull-down node of the first shift register under control of the potential of the pull-up node of the first shift register,
a first control output circuit connected to the pull-up node of the first shift register, the first clock signal terminal and the first control output signal terminal, wherein the first control output circuit is configured to generate a first control output signal based on the signal at the first clock signal terminal and provide the first control output signal to the first control output signal terminal, under control of the potential of the pull-up node of the first shift register;
a second control output circuit connected to the pull-up node of the first shift register, the first clock signal terminal and the second control output signal terminal, wherein the second control output circuit is configured to generate a second control output signal based on the signal at the first clock signal terminal and provide the second control output signal to the second control output signal terminal, under control of the potential of the pull-up node of the first shift register;
a first output circuit connected to the pull-up node of the first shift register, the second clock signal terminal and the first output signal terminal, wherein the first output circuit is configured to generate a first output signal based on the signal at the second clock signal terminal and provide the first output signal to the first output signal terminal, under control of the potential of the pull-up node of the first shift register; and
a first pull-down circuit connected to the first pull-down node and the second pull-down node of the first shift register, the first control output signal terminal, the second control output signal terminal and the first output signal terminal, wherein the first pull-down circuit is configured to pull down a potential of the first control output signal terminal, a potential of the second control output signal terminal and a potential of the first output signal terminal, under control of the first pull-down node and the second pull-down node of the first shift register.

For example, the second shift register includes:
a second input circuit connected to the second input signal terminal and the pull-up node of the second shift register, wherein the second input circuit is configured to input the signal at the second input signal terminal to the pull-up node of the second shift register;
a second control circuit connected to the pull-up node of the second shift register and the first pull-down node of the second shift register, wherein the second control circuit is configured to control the potential of the first pull-down node of the second shift register under control of the potential of the pull-up node of the second shift register;

a second output circuit connected to the pull-up node of the second shift register, the third clock signal terminal and the second output signal terminal, wherein the second output circuit is configured to generate a second output signal based on the signal a the third clock signal terminal and provide the second output signal to the second output signal terminal, under control of the potential of the pull-up node of the second shift register; and a second pull-down circuit connected to the first pull-down node and the second pull-down node of the second shift register and the second output signal terminal, wherein the second pull-down circuit is configured to pull down a potential of the second output signal terminal under control of the first pull-down node and the second pull-down node of the second shift register.

For example, the first control output circuit includes a first transistor having a gate electrode connected to the pull-up node of the first shift register, a first electrode connected to the first clock signal terminal and a second electrode connected to the first control output signal terminal; and the second control output circuit includes a second transistor having a gate electrode connected to the pull-up node of the first shift register, a first electrode connected to the first clock signal terminal and a second electrode connected to the second control output signal terminal.

For example, the first control circuit includes:
a third transistor having a gate electrode and a first electrode connected to a first power signal terminal, and a second electrode connected to the first pull-down node of the first shift register; and
a fourth transistor having a gate electrode connected to the pull-up node of the first shift register, a first electrode connected to a reference signal terminal, and a second electrode connected to the first pull-down node of the first shift register.

For example, the first pull-down circuit includes:
a first pull-down sub-circuit connected to the first pull-down node and the second pull-down node of the first shift register and the first control output signal terminal, wherein the first pull-down sub-circuit is configured to pull down a potential of the first control output signal terminal under control of the first pull-down node and the second pull-down node of the first shift register;
a second pull-down sub-circuit connected to the first pull-down node and the second pull-down node of the first shift register and the second control output signal terminal, wherein the second pull-down sub-circuit is configured to pull down a potential of the second control output signal terminal under control of the first pull-down node and the second pull-down node of the first shift register; and
a third pull-down sub-circuit connected to the first pull-down node and the second pull-down node of the first shift register and the first output signal terminal, wherein the third pull-down sub-circuit is configured to pull down a potential of the first output signal terminal under control of the first pull-down node and the second pull-down node of the first shift register.

For example, the first pull-down sub-circuit includes: a fifth transistor having a gate electrode connected to the first pull-down node of the first shift register, a first electrode connected to the reference signal terminal, and a second electrode connected to the first control output signal terminal; and a sixth transistor having a gate electrode connected to a second pull-down node of the first shift register, a first electrode connected to the reference signal terminal, and a second electrode connected to the first control output signal terminal; and the second pull-down sub-circuit includes: a seventh transistor having a gate electrode connected to the first pull-down node of the first shift register, a first electrode connected to the reference signal terminal, and a second electrode connected to the second control output signal terminal; and an eighth transistor having a gate electrode connected to a second pull-down node of the first shift register, a first electrode connected to the reference signal terminal, and a second electrode connected to the second control output signal terminal.

For example, the second control circuit includes:
a ninth transistor having a gate electrode and a first electrode connected to a second power signal terminal, and a second electrode connected to the first pull-down node of the second shift register; and
a tenth transistor having a gate electrode connected to the pull-up node of the second shift register, a first electrode connected to the reference signal terminal, and a second electrode connected to the first pull-down node of the second shift register.

For example, the first output circuit includes:
an eleventh transistor having a gate electrode connected to the pull-up node of the first shift register, a first electrode connected to the second clock signal terminal, and a second electrode connected to the first output signal terminal; and
a first capacitor having a first terminal connected to the pull-up node of the first shift register and a second terminal connected to the first output signal terminal.

For example, the second output circuit includes:
a twelfth transistor having a gate electrode connected to the pull-up node of the second shift register, a first electrode connected to the third clock signal terminal, and a second electrode connected to the second output signal terminal; and
a second capacitor having a first terminal connected to the pull-up node of the second shift register and a second terminal connected to the second output signal terminal.

For example, the first shift register further includes: a first reset circuit connected to a first reset signal terminal and the pull-up node of the first shift register, wherein the first reset circuit is configured to reset the pull-up node of the first shift register under control of a signal at the first reset signal terminal.

For example, the second shift register further includes: a second reset circuit connected to a second reset signal terminal and the pull-up node of the second shift register, wherein the second reset circuit is configured to reset the pull-up node of the second shift register under control of a signal at the second reset signal terminal.

According to another aspect of the present disclosure, there is provided a gate driving circuit, including N-stages of cascaded shift register units described above, wherein:
a first input signal terminal of a $n^{th}$ stage of shift register unit is connected to a first control output signal terminal of a $(n-2)^{th}$ stage of shift register unit, and a second input signal terminal of the $n^{th}$ stage of shift register unit is connected to a second control output signal terminal of the $(n-2)^{th}$ stage of shift register unit, where n is an integer greater than 1, and N is an integer greater than 1, $2<n<N-4$; and
a first reset signal terminal and a second reset signal terminal of the $n^{th}$ stage of shift register unit are connected to a first control output signal terminal or a second control output signal terminal of a (n+4)$^{th}$ stage of shift register unit.

According to another aspect of the present disclosure, there is provided a display device including the gate driving circuit described above.

According to yet another aspect of the present disclosure, there is provided a method of driving the shift register unit described above, including:

applying a first input signal to a first input signal terminal, applying a first clock signal to a first clock signal terminal, and applying a second clock signal to a second clock signal terminal, such that a first shift register inputs a signal at the first input signal terminal to a pull-up node of the first shift register; and under control of potentials of the pull-up node, a first pull-down node and a second pull-down node of the first shift register, generates a first control output signal and a second control output signal based on a signal at the first clock signal terminal and provides the first control output signal and the second control output signal respectively to a first control output signal terminal and a second control output signal terminal, and generates a first output signal based on a signal at the second clock signal terminal and provides the first output signal to a first output signal terminal; and applying a second input signal to a second input signal terminal, and applying a third clock signal to a third clock signal terminal, such that a second shift register transmits a signal at a second input signal terminal to a pull-up node of the second shift register; and generates a second output signal based on a signal at a third clock signal terminal and provides the second output signal to a second output signal terminal, under control of potentials of the pull-up node, a first pull-down node and a second pull-down node of the second shift register.

BRIEF DESCRIPTION OF THE DRAWINGS

FIG. 6 shows a flowchart of a method of driving a shift register unit according to an embodiment of the present disclosure.

DETAILED DESCRIPTION OF EMBODIMENTS

Figure 1:
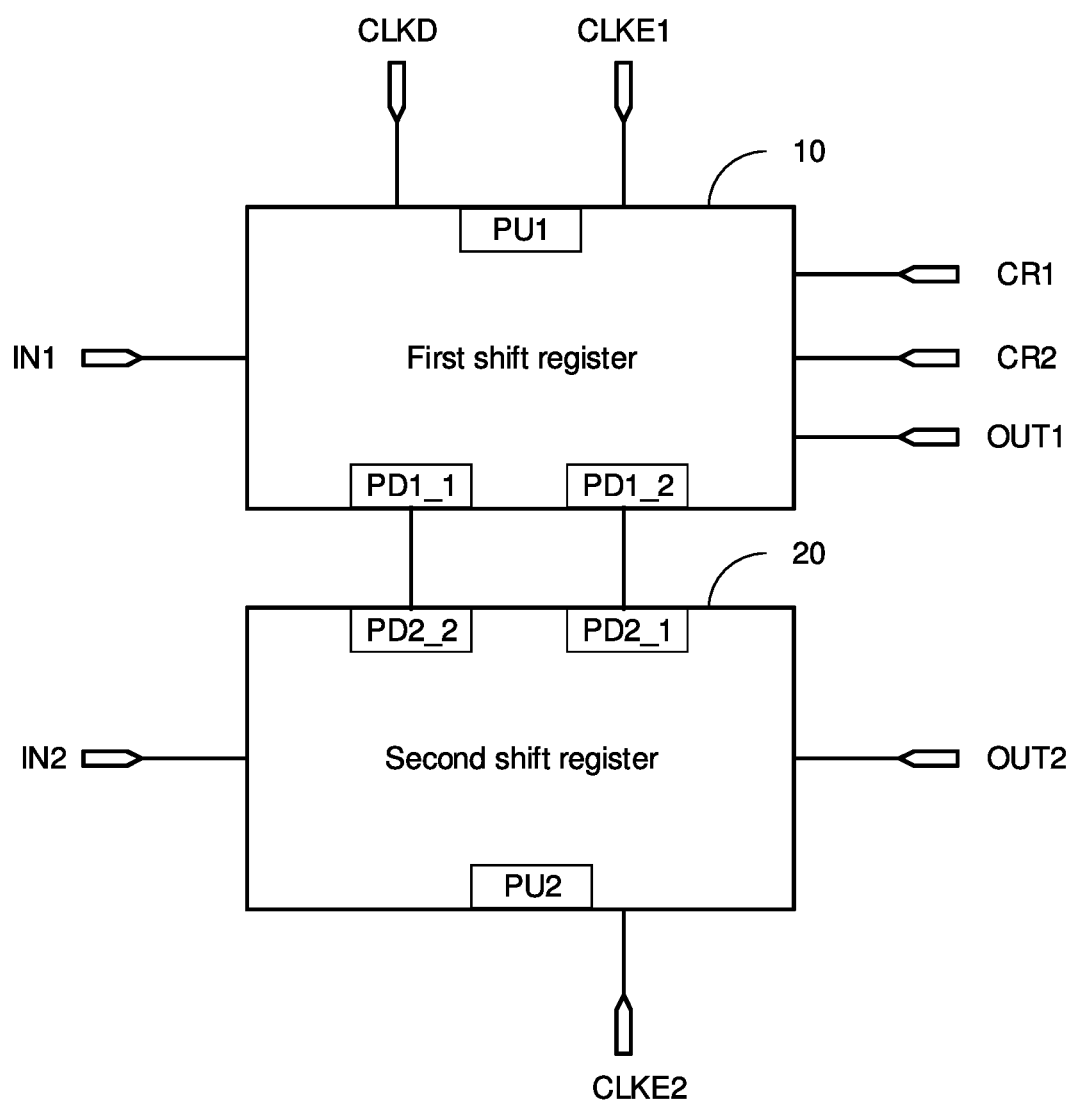
FIG. 1 shows a block diagram of a shift register unit according to an embodiment of the present disclosure.

In order to make objectives, technical solutions and advantages of the present disclosure more apparent, the technical solutions of the present disclosure are clearly and completely described below with reference to the drawings of the embodiments of the present disclosure. Obviously, the embodiments described are only a part but not all of the embodiments of the present disclosure. Based on the embodiments of the present disclosure, all other embodiments obtained by those ordinary skilled in the art without carrying out inventive effort fall within the protection scope of the present disclosure. It should be noted that throughout the drawings, the same elements are represented by the same or similar reference numerals. In the following description, some specific embodiments are only used for descriptive purposes, and should not be construed as limiting the present disclosure. They are merely examples of the embodiments of the present disclosure. When it may cause confusion in the understanding of the present disclosure, conventional structures or configurations will be omitted. It should be noted that the shape and size of each component in the figure do not reflect the actual size and ratio, but merely illustrate the content of the embodiment of the present disclosure.

Unless otherwise defined, the technical or scientific terms used in the embodiments of the present disclosure should have the usual meanings understood by those skilled in the art. The words "first," "second," and the like used in the embodiments of the present disclosure do not indicate any order, quantity or importance, but are only used to distinguish different composition parts.

In addition, in the description of the embodiments of the present disclosure, the term "connected" or "connected to" may mean that two components are directly connected, or that two components are connected via one or more other components. In addition, these two components may be connected or coupled by wired or wireless means.

Transistors used in the embodiments of the present disclosure may all be thin film transistors or field effect transistors or other devices with the same characteristics. For example, the thin film transistor used in the embodiments of the present disclosure may be an oxide semiconductor transistor. Since the thin film transistor used here have symmetrical source and drain electrodes, the source and drain electrodes may be interchanged. In the embodiments of the present disclosure, one of the source electrode and the drain electrode is called a first electrode, and the other is called a second electrode. In the following examples, an N-type thin film transistor is taken as an example for description. The embodiments of the present disclosure may be applied to a case of P-type thin film transistors.

In a related art, the gate driving circuit may include a plurality of cascaded shift registers. An output signal generated by each shift register is used as an input signal of the next stage of shift register, so that an output signal generated by the next stage of shift register is shift with respect to the output signal of the former stage of shift register. In order to prevent the output signal generated by the each shift register from being affected by other shift registers connected to the each shift register, a separate control output signal terminal and a separate output signal terminal are provided to the each shift register, and a control output signal consistent with the output signal at the output signal terminal is provided at the control output signal terminal. Each shift register is cascaded with other shift registers through the control output signal terminal. However, in a conventional technology, each shift register needs to be connected to a separate clock signal terminal so as to generate a corresponding control output signal. For a gate driving circuit that requires multiple clock signals, too many clock signal terminals may increase complexity of circuit and wiring.

FIG. 1 shows a block diagram of a shift register unit according to an embodiment of the present disclosure.

As shown in FIG. 1, the shift register unit includes a first shift register 10 and a second shift register 20. The first shift register 10 includes a pull-up node PU1, a first pull-down node PD1_1, and a second pull-down node PD1_2. The second shift register 20 includes a pull-up node PU2, a first pull-down node PD2_1, and a second pull-down node PD2_2. The first pull-down node PD1_1 of the first shift register 10 is connected to the second pull-down node PD2_2 of the second shift register 20, and the second pull-down node PD1_2 of the first shift register 10 is connected to the first pull-down node PD2_1 of the second shift register 20.

The first shift register 10 may be connected to a first input signal terminal IN1, a first clock signal terminal CLKD, a second clock signal terminal CLKE1, a first control output signal terminal CR1, a second control output signal terminal CR2, and a first output signal terminal OUT1. The first shift register 10 may input a signal at the first input signal terminal IN1 to the pull-up node PU1, and may generate a first control output signal and a second control output signal based on a signal at the first clock signal terminal CLKD and provide the first control output signal and the second control output signal respectively to the first control output signal terminal CR1 and the second control output signal terminal CR2, and generate a first output signal based on a signal at the second clock signal terminal CLKE1 and provide the first output signal to the first output signal terminal OUT1, under control of potentials of the pull-up node PU1, the first pull-down node pd1_1 and the second pull-down node PD1_2.

The second shift register 20 may be connected to a second input signal terminal IN2, a third clock signal terminal CLKE2, and a second output signal terminal OUT2. The second shift register 20 may transmit a signal at the second input signal terminal IN2 to the pull-up node PU2, and may generate a second output signal based on a signal at the third clock signal terminal CLKE2 and provide the second output signal to the second output signal terminal OUT2, under control of potentials of the pull-up node PU2, the first pull-down node PD2_1 and the second pull-down node PD2_2.

By connecting the pull-down node of the first shift register and the pull-down node of the second shift register and enabling the first shift register to generate two control output signals based on the same clock, the second shift register does not need to be connected to a dedicated clock signal terminal and equipped with a dedicated circuit to generate the control output signal for the second shift register, so that the wiring of the clock signal terminal and an occupied space may be reduced. However the embodiments of the present disclosure are not limited to a case that a clock signal terminal is shared by two shift registers as described above. A number of the shift registers that share the clock signal terminal may be selected as desired. For example, the shift register unit may include three shift registers, one shift register may generate three control output signals based on the signal at the same clock signal terminal, while the other two shift registers may not be connected to a dedicated clock signal terminal to generate corresponding control output signals, so as to further reduce the wiring of the clock signal terminal.

Figure 2:
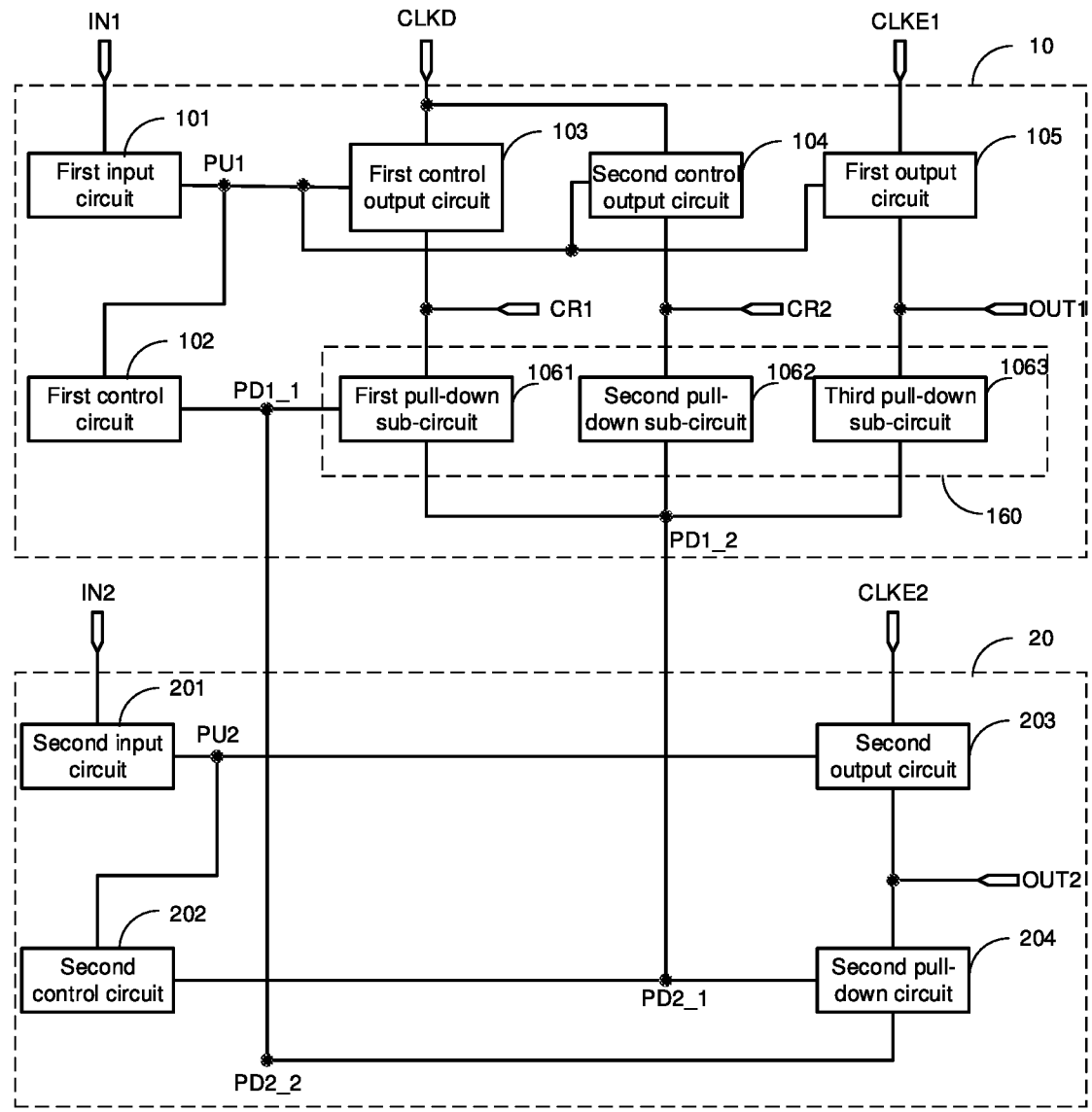
FIG. 2 shows a block diagram of a shift register unit according to another embodiment of the present disclosure.

FIG. 2 shows a block diagram of a shift register unit according to another embodiment of the present disclosure.

As shown in FIG. 2, the first pull-down node PD1_1 of the first shift register 10 is connected to the second pull-down node PD2_2 of the second shift register 20, and the second pull-down node PD1_2 of the first shift register 10 is connected to the first pull-down node PD2_1 of the second shift register 20.

The first shift register 10 may include a first input circuit 101, a first control circuit 102, a first control output circuit 103, a second control output circuit 104, a first output circuit 105, and a first pull-down circuit 106.

The first input circuit 101 is connected to the first input signal terminal IN and the pull-up node PU1 of the first shift register 10. The first input circuit 10 may input a signal at the first input signal terminal IN to the pull-up node PU1.

The first control circuit 102 is connected to the pull-up node PU1 of the first shift register 10 and the first pull-down node PD1_1 of the first shift register 10. The first control circuit 102 may control a potential of the first pull-down node PD1_1 under control of a potential of the pull-up node PU1.

The first control output circuit 103 is connected to the pull-up node PU1 of the first shift register 10, the first clock signal terminal CLKD, and the first control output signal terminal CR1. The first control output circuit 103 may generate a first control output signal based on a signal at the first clock signal terminal CLKD and provide the first control output signal to the first control output signal terminal CR1, under control of the potential of the pull-up node PU1.

The second control output circuit 104 is connected to the pull-up node PU1 of the first shift register 10, the first clock signal terminal CLKD, and the second control output signal terminal CR2. The second control output circuit 104 may generate a second control output signal based on the signal at the first clock signal terminal CLKD and provide the second control output signal to the second control output signal terminal CR2, under control of the potential of the pull-up node PU1.

The first output circuit 105 is connected to the pull-up node PU1 of the first shift register, the second clock signal terminal CLKE1, and the first output signal terminal OUT1. The first output circuit 105 may generate a first output signal based on a signal at the second clock signal terminal CLKE1 and provide the first output signal to the first output signal terminal OUT1, under control of the potential of the pull-up node PU1.

The first pull-down circuit 106 is connected to the first pull-down node PD1_1 and the second pull-down node PD1_2 of the first shift register, the first control output signal terminal CR1, the second control output signal terminal CR2, and the first output signal terminal OUT1. The first pull-down circuit 106 may pull down a potential of the first control output signal terminal CR1, a potential of the second control output signal terminal CR2 and a potential of the first output signal terminal, under control of the first pull-down node PD1_1 and the second pull-down node PD1_2 of the first shift register 10.

In an example shown in FIG. 2, the first pull-down circuit 106 may include a first pull-down sub-circuit 1061, a second pull-down sub-circuit 1602, and a third pull-down sub-circuit 1603.

The first pull-down sub-circuit 1601 is connected to the first pull-down node PD1_1 and the second pull-down node PD1_2 of the first shift register 10, and the first control output signal terminal CR1. The first pull-down sub-circuit 1601 may pull down the potential of the first control output signal terminal CR1 under control of the first pull-down node PD1_1 and the second pull-down node PD1_2.

The second pull-down sub-circuit 1062 is connected to the first pull-down node PD1_1 and the second pull-down node PD1_2 of the first shift register and the second control output signal terminal CR2. The second pull-down sub-circuit 1062 may pull down a potential of the second control output signal terminal CR2 under control of the first pull-down node PD1_1 and the second pull-down node PD1_2.

The third pull-down sub-circuit 1063 is connected to the first pull-down node PD1_1 and the second pull-down node PD1_2 of the first shift register 10, and the first output signal terminal OUT1. The third pull-down sub-circuit 1063 may pull down a potential of the first output signal terminal OUT1 under control of the first pull-down node PD1_1 and the second pull-down node PD1_2.

As shown in FIG. 2, the second shift register 20 may include a second input circuit 201, a second control circuit 202, a second output circuit 203, and a second pull-down circuit 204.

The second input circuit 201 is connected to the second input signal terminal IN2 and the pull-up node PU2 of the second shift register. The second input circuit IN2 may input the signal at the second input signal terminal IN2 to the pull-up node PU2 of the second shift register.

The second control circuit 202 is connected to the pull-up node PU2 and the first pull-down node PD2_1 of the second shift register 20. The second control circuit 102 may control a potential of the first pull-down node PD2_1 under control of the potential of the pull-up node PU2.

The second output circuit 203 is connected to the pull-up node PU2 of the second shift register 20, the third clock signal terminal CLKE2, and the second output signal terminal OUT2. The second output circuit 203 may generate a second output signal based on a signal at the third clock signal terminal CLKE2 and provide the second output signal to the second output signal terminal OUT2, under control of the potential of the pull-up node PU2.

The second pull-down circuit 204 is connected to the first pull-down node PD2_1 and the second pull-down node PD2_2 of the second shift register 20, and the second output signal terminal OUT2. The second pull-down circuit 204 may pull down the potential of the second output signal terminal OUT2 under control of the first pull-down node PD2_1 and the second pull-down node PD2_2.

Figure 3A:
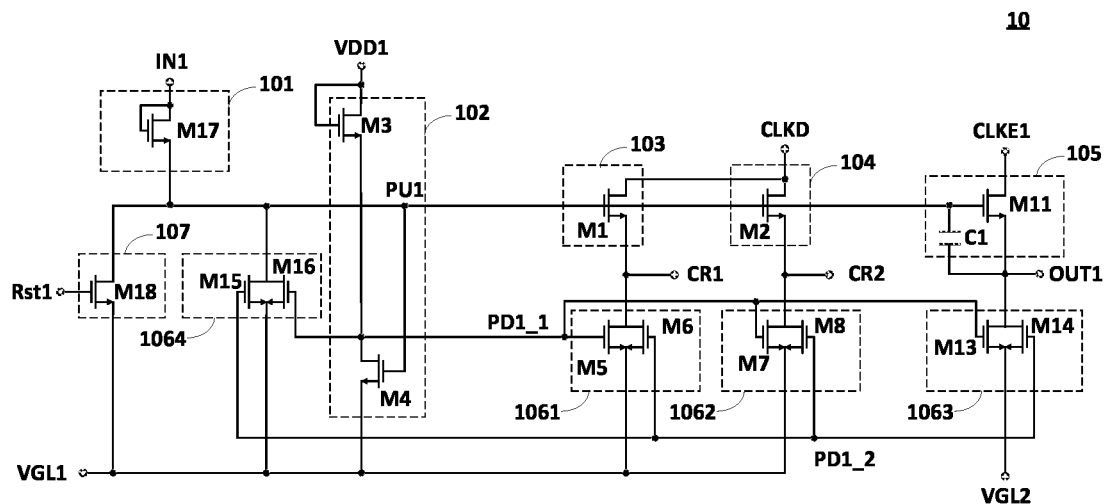
FIG. 3A shows an exemplary circuit diagram of a first shift register in a shift register unit according to an embodiment of the present disclosure.
Figure 3B:
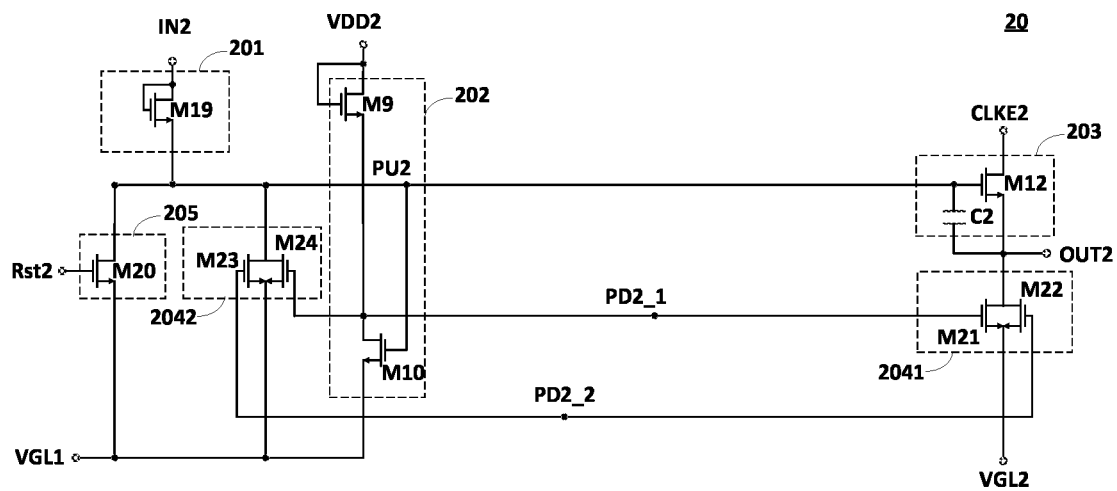
FIG. 3B shows an exemplary circuit diagram of a second shift register in a shift register unit according to an embodiment of the present disclosure.

FIG. 3A shows an exemplary circuit diagram of a first shift register in a shift register unit according to an embodiment of the present disclosure. FIG. 3B shows an exemplary circuit diagram of a second shift register in a shift register unit according to an embodiment of the present disclosure. The above description about the shift register unit of FIG. 1 and FIG. 2 is also applicable to FIG. 3A and FIG. 3B.

As shown in FIG. 3A, the first shift register 10 may include a first input circuit 101, a first control circuit 102, a first control output circuit 103, a second control output circuit 104, a first output circuit 105, and a first pull-down circuit 106.

The first input circuit 101 may include a transistor M17. The transistor M17 has a gate electrode and a first electrode connected to the first input signal terminal IN1, and a second electrode connected to the pull-up node PU1 of the first shift register 10.

The first control circuit 102 may include a transistor M3 (a third transistor) and a transistor M4 (a fourth transistor). The transistor M3 has a gate electrode and a first electrode connected to a first power signal terminal VDD1, and a second electrode connected to the first pull-down node PD1_1 of the first shift register 10. The transistor M4 has a gate electrode connected to the pull-up node PU1 of the first shift register 10, a first electrode connected to a reference signal terminal VGL1, and a second electrode connected to the first pull-down node PD1_1 of the first shift register 10.

The first control output circuit 103 may include a transistor M1 (a first transistor). The transistor M1 has a gate electrode connected to the pull-up node PU1 of the first shift register 10, a first electrode connected to the first clock signal terminal CLKD, and a second electrode connected to the first control output signal terminal CR1.

The second control output circuit 104 may include a transistor M2 (a second transistor). The transistor M2 has a gate electrode connected to the pull-up node PU1 of the first shift register 10, a first electrode connected to the first clock signal terminal CLKD, and a second electrode connected to the second control output signal terminal CR2.

The first output circuit 105 may include a transistor M11 (an eleventh transistor) and a capacitor C1 (a first capacitor). The transistor M11 has a gate electrode connected to the pull-up node PU1 of the first shift register 10, a first electrode connected to the second clock signal terminal CLKE1, and a second electrode connected to the first output signal terminal OUT1. The capacitor C1 has a first terminal connected to the pull-up node PU1, and a second terminal connected to the first output signal terminal OUT1.

As shown in FIG. 3A, similar to FIG. 2, the first pull-down circuit may include a first pull-down sub-circuit 1061, a second pull-down sub-circuit 1062, and a third pull-down sub-circuit 1063.

The first pull-down sub-circuit 1061 may include a transistor M5 (a fifth transistor) and a transistor M6 (a sixth transistor). The transistor M5 has a gate electrode connected to the first pull-down node PD1_1 of the first shift register 10, a first electrode connected to the reference signal terminal VGL1, and a second electrode connected to the first control output signal terminal CR1. The transistor M6 has a gate electrode connected to the second pull-down node PD1_2 of the first shift register 10, a first electrode connected to the reference signal terminal VGL1, and a second electrode connected to the first control output signal terminal CR1.

The second pull-down sub-circuit 1062 may include a transistor M7 (a seventh transistor) and a transistor M8 (an eighth transistor). The transistor M7 has a gate electrode connected to the first pull-down node PD1_1 of the first shift register 10, a first electrode connected to the reference signal terminal VGL1, and a second electrode connected to the second control output signal terminal CR2. The transistor M8 has a gate electrode connected to the second pull-down node PD1_2 of the first shift register 10, a first electrode connected to the reference signal terminal VGL1, and a second electrode connected to the second control output signal terminal CR2.

The third pull-down sub-circuit 1063 includes a transistor M13 and a transistor M14. The transistor M13 has a gate electrode connected to the first pull-down node PD1_1, a first electrode connected to a reference signal terminal VGL2, and a second electrode connected to the first output signal terminal OUT1. The transistor M14 has a gate electrode connected to the second pull-down node PD1_2, a first electrode connected to the reference signal terminal VGL2, and a second electrode connected to the first output signal terminal OUT1.

In some embodiments, as shown in FIG. 3A, the first pull-down circuit may further include a fourth pull-down sub-circuit 1064 for pulling down the pull-up node PU1 of the first shift register 10. The fourth pull-down sub-circuit 1064 may pull down the potential of the pull-up node PU1 of the first shift register 10 under control of the first pull-down node PD1_1 and the second pull-down node PD1_2. In an example shown in FIG. 3A, the fourth pull-down sub-circuit 1064 includes a transistor M15 and a transistor M16. The transistor M15 has a gate electrode connected to the first pull-down node PD1_1, a first electrode connected to the reference signal terminal VLG1, and a second electrode connected to the pull-up node PU1. The transistor M16 has a gate electrode connected to the second pull-down node PD1_2, a first electrode connected to the reference signal terminal VLG1, and a second electrode connected to the pull-up node PU1.

In some embodiments, as shown in FIG. 3A, the first shift register 10 may further include a first reset circuit 107 connected to the first reset signal terminal Rst1 and the pull-up node PU1 of the first shift register 10. The first reset circuit 107 may reset the pull-up node PU1 under control of a signal of the first reset signal terminal Rst1. In the example shown in FIG. 3A, the first reset circuit 107 may include a transistor M18. The transistor M18 has a gate electrode connected to the first reset signal terminal Rst1, a first electrode connected to the reference signal terminal VGL1, and a second electrode connected to the pull-up node PU1.

As shown in FIG. 3B, the second shift register 20 may include a second input circuit 201, a second control circuit 202, a second output circuit 203, and a second pull-down circuit 204.

The second input circuit 201 may include a transistor M19. The transistor M19 has a gate electrode and a first electrode connected to the second input signal terminal IN2.

The second control circuit 202 may include a transistor M9 (a ninth transistor) and a transistor M10 (a tenth transistor). The transistor M9 has a gate electrode and a first electrode connected to a second power signal terminal VDD2, and a second electrode connected to the first pull-down node PD2_1 of the second shift register 20. The transistor M10 has a gate electrode connected to the pull-up node PU2 of the second shift register 20, a first electrode connected to the reference signal terminal VGL1, and a second electrode connected to the first pull-down node PD2_1 of the second shift register 20.

The second output circuit 203 includes a transistor M12 (a twelfth transistor) and a capacitor C2 (a second capacitor). The transistor M12 has a gate electrode connected to the pull-up node PU2 of the second shift register 20, a first electrode connected to the third clock signal terminal CLKE2, and a second electrode connected to the second output signal terminal OUT2. The capacitor C2 has a first terminal connected to the pull-up node PU2 of the second shift register 20, and a second terminal connected to the second output signal terminal OUT2.

Similar to FIG. 3A, in an example shown in FIG. 3B, the second pull-down circuit may include a fifth pull-down sub-circuit 2041 for pulling down the second output signal terminal OUT2. The fifth pull-down sub-circuit 2041 may include a transistor M21 and a transistor M22. The transistor M21 has a gate electrode connected to the first pull-down node PD2_1, a first electrode connected to the reference signal terminal VGL2, and a second electrode connected to the second output signal terminal OUT2. The transistor M22 has a gate electrode connected to the second pull-down node PD2_2, a first electrode connected to the reference signal terminal VGL2, and a second electrode connected to the second output signal terminal OUT2.

In some embodiments, as shown in FIG. 3B, the second pull-down circuit may further include a pull-down sub-circuit 2042 for pulling down the pull-up node PU2 of the second shift register 20. The pull-down sub-circuit 2042 may include a transistor M23 and a transistor M24. The transistor M23 has a gate electrode connected to the second pull-down node PD2_2, a first electrode connected to the reference signal terminal VGL1, and a second electrode connected to the pull-up node PU2. The transistor M24 has a gate electrode connected to the first pull-down node PD2_1, a first electrode connected to the reference signal terminal VGL1, and a second electrode connected to the pull-up node PU2.

In the example shown in FIG. 3B, the second shift register 20 may further include a second reset circuit 205 connected to the second reset signal terminal Rst2 and the pull-up node PU2 of the second shift register 20. The second reset circuit 205 may reset the pull-up node PU2 of the second shift register 20 under control of the signal of the second reset signal terminal Rst2. For example, the second reset circuit 205 may include a transistor M20. The transistor M20 has a gate electrode connected to the second reset signal terminal Rst2, a first electrode connected to the reference signal terminal VGL1, and a second electrode connected to the pull-up node PU2.

According to the embodiments of the present disclosure, because the two control output signals are generated by the same shift register, there is no need to provide a special circuit for each of the two shift registers to reset respective pull-down nodes. For example, there is no need to provide a special reset circuit in the first shift register to reset the first pull-down node of the first shift register based on the potential of the pull-up node of the second shift register, or provide a special reset circuit in the second shift register to reset the potential of the first pull-down node of the second shift register based on the potential of the pull-up node of the first shift register. In this way, a circuit structure of the shift register unit in the embodiments of the present disclosure is simplified compared to the conventional technology, thereby facilitating a realization of a narrow frame of a display screen.

Figure 4A:
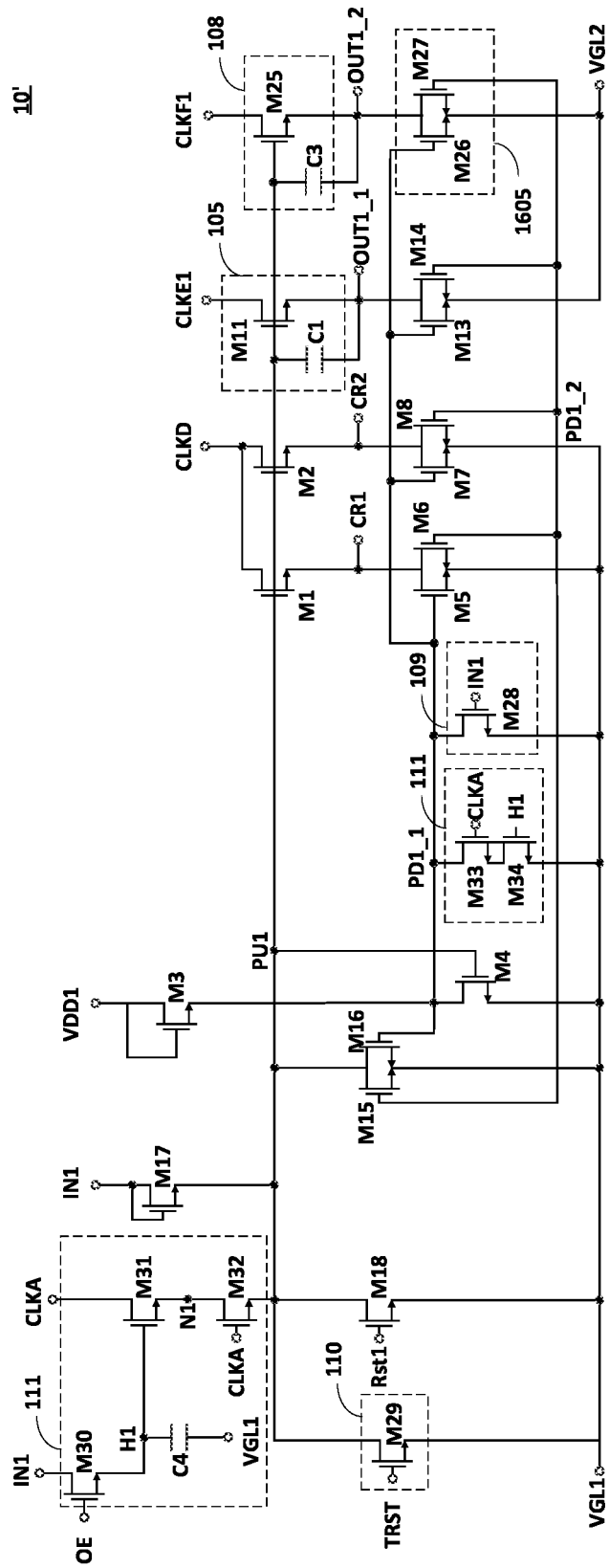
FIG. 4A shows another exemplary circuit diagram of a first shift register in a shift register unit according to an embodiment of the present disclosure.
Figure 4B:
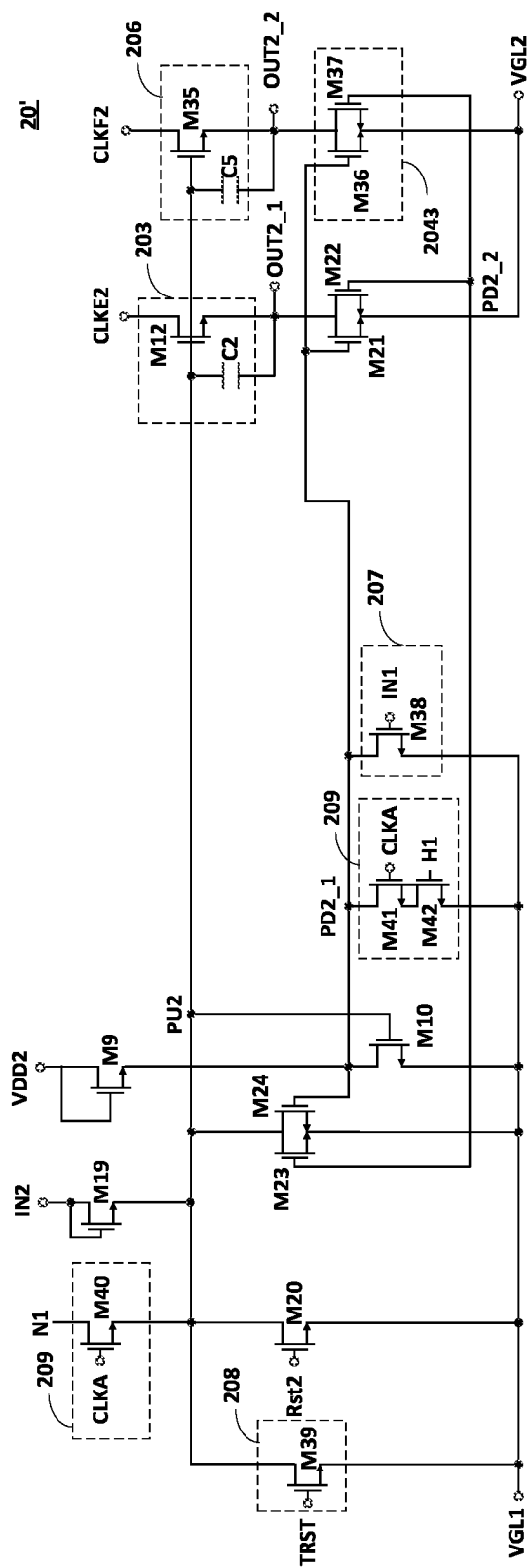
FIG. 4B shows another exemplary circuit diagram of a second shift register in a shift register unit according to an embodiment of the present disclosure.

FIG. 4A shows another exemplary circuit diagram of a first shift register in a shift register unit according to an embodiment of the present disclosure. FIG. 4B shows another exemplary circuit diagram of a second shift register in a shift register unit according to an embodiment of the present disclosure. A first shift register 10' in FIG. 4A is similar to the first shift register 10 in FIG. 3A, and a second shift register 20' in FIG. 4B is similar to the second shift register 20 in FIG. 3A. The above description for FIG. 3A and FIG. 3B may also be applied to FIG. 4A and FIG. 4B. For the sake of conciseness, the following will mainly describe the different parts in detail.

As shown in FIG. 4A, different from FIG. 3A, the first shift register 10' includes two first output circuits. That is, in addition to the first output circuit 105 (the transistor M11 and the capacitor C1) described above, the first shift register 10' further includes a first output circuit 108. The first output circuit 105 may generate a first output signal based on the signal at the second clock signal terminal CLKE1 and provide the first output signal to the first output signal terminal OUT1_1. The first output circuit 108 may generate a further first output signal based on the signal at a further second clock signal terminal CLKF1 and provide the further first output signal to the further first output signal terminal OUT1_2, under control of the potential of the pull-up node PU1. Accordingly, the first shift register further includes a pull-down sub-circuit 1065 for pulling down the first output signal terminal OUT1_2. In FIG. 4A, the first output circuit 108 includes a transistor M25 and a capacitor C3, and the pull-down sub-circuit 1065 includes a transistor M26 and a transistor M27. The transistor M25 has a gate electrode connected to the pull-up node PU1, a first electrode connected to the second clock signal terminal CLKF1, and a second electrode connected to the first output signal terminal OUT1_2. The capacitor C3 has a first terminal connected to the gate electrode of the transistor M25, and a second terminal connected to the second electrode of the transistor M25. The transistor M26 has a gate electrode connected to the first pull-down node PD1_1, a first electrode connected to the reference signal terminal VGL2, and a second electrode connected to the first output signal terminal OUT1_2. The transistor M27 has a gate electrode connected to the second pull-down node PD1_2, a first electrode connected to the reference signal terminal VGL2, and a second electrode connected to the first output signal terminal OUT1_2. Although the first output circuit 105 and the first output circuit 108 are illustrated above by way of example, the embodiments of the present disclosure are not limited thereto. A number of the first output circuits and the clock signal terminals connected thereto may be set as required.

In FIG. 4A, the first shift register 10' may further include a first adjustment circuit 109. The first adjustment circuit 109 may pull down the first pull-down node PD1_1 to the reference signal terminal VGL1 under control of the potential of the first input signal terminal IN1. By providing the first adjustment circuit 109, it is possible to prevent the pull-down of the first pull-down node PD1_1 from being affected due to the potential of the pull-up node PU1 failing to reach a desired level. The first adjustment circuit 109 may include a transistor M28. The transistor M28 has a gate electrode connected to the first input signal terminal IN1, a first electrode connected to the reference signal terminal VGL1, and a second electrode connected to the first pull-down node PD1_1.

In FIG. 4A, the first shift register 10' may further include a first total reset circuit 110 that may reset the pull-up node PU1 under control of a total reset signal at a total reset signal terminal TRST. In FIG. 4A, the first total reset circuit 110 includes a transistor M29. The transistor M29 has a gate electrode connected to the total reset signal terminal TRST, a first electrode connected to the reference signal terminal VGL1, and a second electrode connected to the pull-up node PU1.

As shown in FIG. 4B, the second shift register 20' may include a plurality of second output circuits. For example, in addition to the second output circuit 203, the second shift register 20' may further include a second output circuit 206. The second output circuit 203 and the second output circuit 206 are respectively connected to the third clock signal terminals CLKE2 and CLKF2, and are further connected to the second output signal terminals OUT2_1 and OUT2_2, respectively. Accordingly, the second shift register 20' may further include a pull-down sub-circuit 2043 for pulling down the second output signal terminal OUT2_2. In FIG. 4B, the pull-down sub-circuit 2043 includes a transistor M36 and a transistor M37. The transistor M36 has a gate electrode connected to the first pull-down node PD2_1, a first electrode connected to the reference signal terminal VGL2, and a second electrode connected to the second output signal terminal OUT2_2. The transistor M37 has a gate electrode connected to the second pull-down node PD2_2, a first electrode connected to the reference signal terminal VGL2, and a second electrode connected to the second output signal terminal OUT2_2.

As shown in FIG. 4B, in some embodiments, the second shift register 20' may further include a second adjustment circuit 207 for stabilizing the potential of the first pull-down node PD2_1. In some embodiments, the second shift register 20' may further include a second total reset circuit 208. The second adjustment circuit 207 may include a transistor M38. The transistor M38 has a gate electrode connected to the first input signal terminal IN1, a first electrode connected to the reference signal terminal VGL1, and a second electrode connected to the first pull-down node PD2_1. The second total reset circuit 208 may include a transistor M39. The transistor M39 has a gate electrode connected to the total reset signal terminal TRST, a first electrode connected to the reference signal terminal VGL1, and a second electrode connected to the pull-up node PU2.

In some embodiments, the shift register unit may further have a random sensing function, with which the shift register units in the gate driving circuit may be randomly selected. The shift register unit selected may generate an output to drive a corresponding pixel on the display panel during a blanking phase, so as to sense the pixel driven. The shift register unit not selected does not generate an output.

For example, as shown in FIG. 4A and FIG. 4B, the first shift register 10' may further include a first random sensing circuit 111, and the second shift register 10' may further include a second random sensing circuit 209.

The first random sensing circuit 111 includes transistors M30, M31, M32, M33 and M34, and a capacitor C4. The transistor M30 has a gate electrode connected to a first control signal terminal OE, a first electrode connected to the first input signal terminal IN1, and a second electrode connected to a node H1. The transistor M31 has a gate electrode connected to the node H1, a first electrode connected to a second control signal terminal CLKA, and a second electrode connected to a node N1. The transistor M32 has a gate electrode connected to the second control signal terminal CLKA, a first electrode connected to the node N1, and a second electrode connected to the pull-up node PU1. The transistors M33 and M34 are connected in series between the first pull-down node PD1_1 and the reference signal terminal VGL1. The gate electrode of the transistor M33 is connected to the second control signal terminal CLKA, and the gate electrode of the transistor M34 is connected to the node H1.

The second random sensing circuit 209 includes transistors M40, M41 and M42. The transistor M40 has a gate electrode connected to the second control signal terminal CLKA, a first electrode connected to the node N1, and a second electrode connected to the pull-up node PU2. The transistors M41 and M42 are connected in series between the first pull-down node PD2_1 and the reference signal terminal VGL1. The gate electrode of the transistor M41 is connected to the second control signal terminal CLKA, and the gate electrode of the transistor M42 is connected to the node H1.

Although a specific structure of the first shift register and the second shift register is illustrated above, the embodiments of the present disclosure are not limited thereto. Other structures of the first shift register and the second shift register may be adopted in the shift register unit of the embodiments of the present disclosure as needed. In addition, although the two reference signal terminals VGL1 and VGL2 are illustrated above by way of example, the embodiments of the present disclosure are not limited thereto. The reference signal terminals VGL1 and VGL2 may also be implemented as one reference signal terminal.

The embodiments of the present disclosure further provide a gate driving circuit, which will be described below with reference to FIGS. 5A/5B.

Figure 5A:
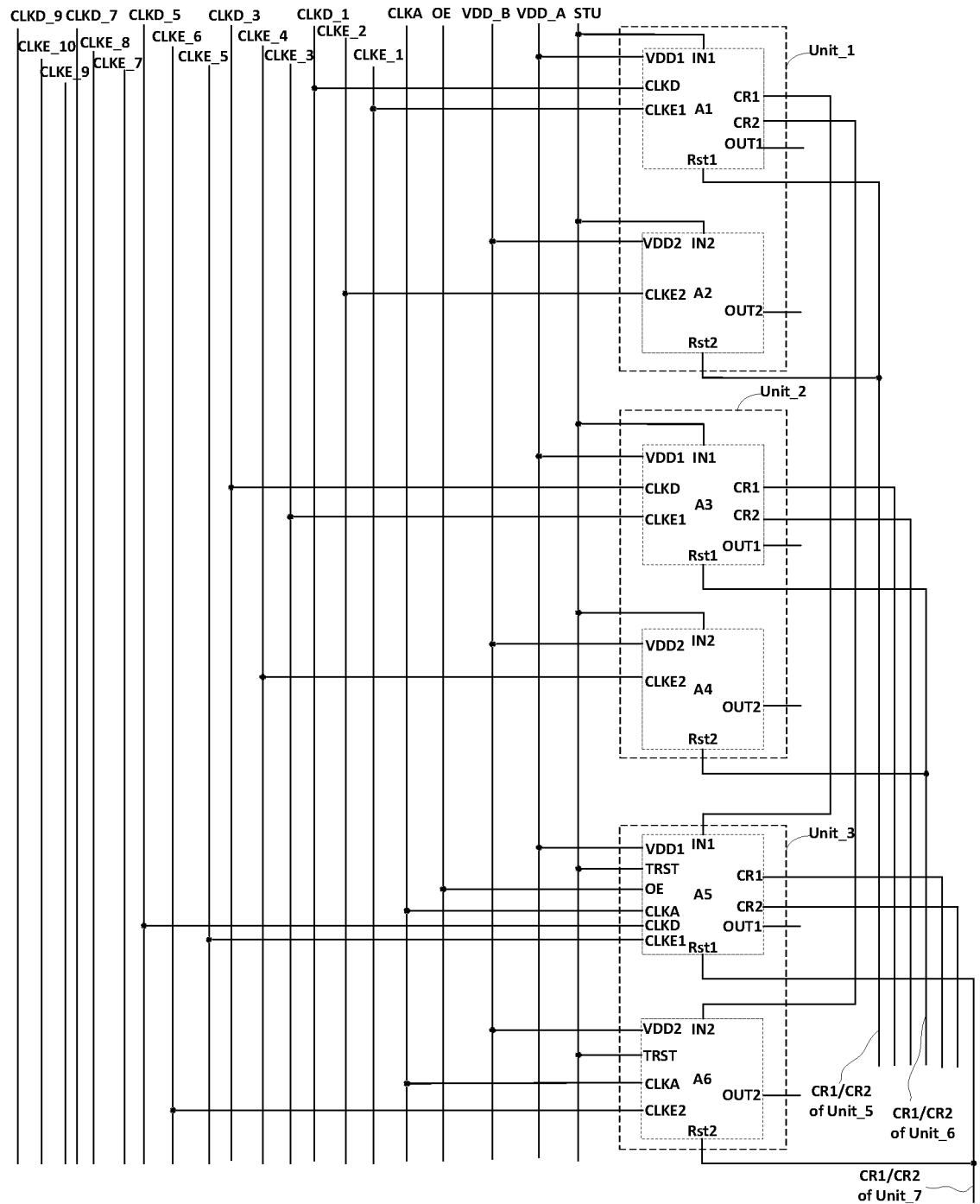
FIG. 5A and FIG. 5B show a block diagram of a gate driving circuit according to an embodiment of the present disclosure.
Figure 5B:
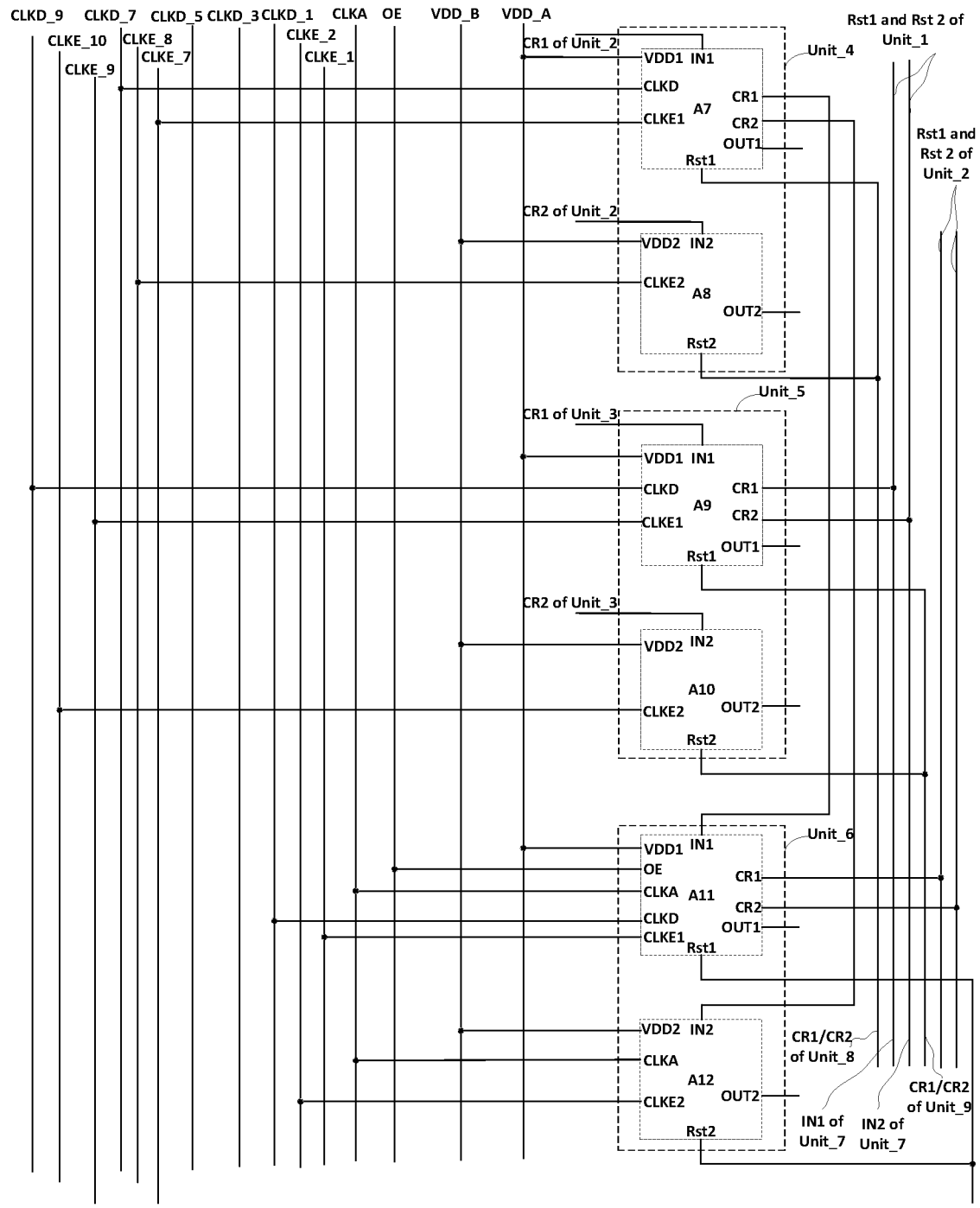

FIGS. 5A/5B show a block diagram of a gate driving circuit according to an embodiment of the present disclosure. The gate driving circuit includes N stages of cascaded shift register units, which may be implemented by the shift register unit of any of the embodiments described above, where N is an integer greater than 1.

As shown in FIGS. 5A/5B, the gate driving circuit includes N stages of cascaded shift register units Unit1, Unit2, Unit3 . . . , UnitN. Each of the shift register unit Unit1, Unit2, Unit3 . . . , UnitN may be implemented by the shift register unit of any of the embodiments described above. Here, each shift register unit including the first shift register shown in FIG. 4A and the second shift register shown in FIG. 4B is illustrated by way of example.

As shown in FIGS. 5A/5B, each of the shift register units Unit_1, Unit_2, Unit_3 . . . , Unit_N includes two shift registers. For example, the shift register unit Unit_1 includes shift registers A1 and A2, the shift register unit Unit_2 includes shift registers A3 and A4, and so on. Thus, by cascading the N shift register units, 2N stages of shift registers A1, A2, . . . , A2N may be obtained. For brevity, only the first six stages of shift register units Unit_1, Unit_2, Unit_3, Unit_4, Unit_5 and Unit_6 including six stages of shift registers A1 to A12 are shown in FIGS. 5A/5B. However, the embodiments of the present disclosure are not limited to this, and a number N of the shift register units N may be set as required.

In FIGS. 5A/5B, the odd-numbered stages of shift registers A1, A3, A5, . . . are the first shift registers and have the structure shown in FIG. 4A, and the even-numbered stages of shift registers A2, A4, A6 . . . are the second shift registers and have the structure shown in FIG. 4B. However, the embodiments of the present disclosure are not limited thereto, and the so-called "odd" and "even" may be used interchangeably. The first pull-down node and the second pull-down node of the first shift register (for example, A1) and the first pull-down node and the second pull-down node of the second shift register (for example, A2) may be connected with reference to FIG. 1 and FIG. 2.

In FIGS. 5A/5B, the input signal terminals IN1 and IN2 of the first two stages of shift register units Unit_1 and Unit_2 are both connected to receive a start signal terminal STU. Starting from n=3, the first input signal terminal IN1 of a $n^{th}$ stage of shift register unit Unit_n (for example, Unit_3) is connected to the first control output signal terminal CR1 of a $(n-2)^{th}$ stage of shift register unit Unit_(n-2) (for example, Unit_1), and the second input signal terminal IN2 of the $n^{th}$ stage of shift register unit Unit_n is connected to the second control output signal terminal CR2 of the $(n-2)^{th}$ stage of shift register unit Unit_(n-2). The first reset signal terminal Rst1 and the second reset signal terminal Rst2 of the $n^{th}$ stage of shift register unit Unit_n (for example Unit_1) may be connected to the first control output signal terminal CR1 or the second control output signal terminal CR2 of the $(n+4)^{th}$ stage of shift register unit Unit_(n-2) (for example, the first control output signal terminal CR1<9> of the shift register A9 in the fifth stage of shift register unit Unit_5).

The first clock signal terminal CLKD of each shift register unit Unit_n is connected to receive the corresponding first clock signal. For example, the first clock signal terminal CLKD of the shift register A1 in the first stage of shift register unit Unit_1 is connected to receive a first clock signal CLKD_1, the first clock signal terminal CLKD of the shift register A3 in the second stage of shift register unit Unit_2 is connected to receive a first clock signal CLKD_3, and so on. Since there is no need to provide a dedicated clock signal terminal CLKD for the second shift register (the even-numbered shift registers A2, A4, A6, . . . in FIGS. 5A/5B), the number of the clock signal terminals CLKD may be reduced to half. For example, compared to a conventional gate driving circuit that requires 10 clock signals CLKD_1, CLKD_2, . . . CLKD_10 for generating 10 control output signals, 5 clock signals CLKD_1, CLKD3, CLK5, CLK7 and CLK9 may be used to generate 10 control output signals in the embodiments of the present disclosure, so that the number of the clock signal terminals of the shift register unit may be reduced, and the circuit structure and wiring may be simplified.

The second clock signal terminal CLKE1 and the third clock signal terminal CLKE2 of each shift register unit Unit_n may be connected to receive corresponding clock signals CLKE_1, CLKE_2, . . . . For example, the clock signal terminals CLKE1 and CLKE2 of the first stage of shift register unit Unit_1 are connected respectively to receive clock signals CLKE_1 and CLKE_2, the clock signal terminals CLKE1 and CLKE2 of the second stage of shift register unit Unit_2 are connected to respectively receive clock signals CLKE_3 and CLKE_4, the clock signal terminals CLKE1 and CLKE2 of the third stage of shift register unit Unit_3 are connected respectively to receive clock signals CLKE_5 and CLKE_6, and so on. In a similar manner, the clock signal terminals CLKF1 and CLKF2 of each shift register unit Unit_n may be connected to receive corresponding clock signals CLKF_1, CLKF_2, . . . CLKF_10.

In a case that the shift register unit includes a random sensing circuit as shown in FIG. 4A and FIG. 4B, the shift register unit is further connected to receive the first control signal and the second control signal. For example, in FIGS. 5A/5B, the first control signal terminal OE of the shift register unit Unit3 is connected to receive the first control signal, and the second control signal terminal CLKA of the shift register unit Unit3 is connected to receive the second control signal.

Although the gate driving circuit has been described in a specific cascading manner above, the embodiments of the present disclosure are not limited to this, and the number of the shift register units in the gate driving circuit and the cascading manner thereof may be set as required.

FIG. 6 shows a flowchart of a method of driving a shift register unit according to an embodiment of the present disclosure. The method is applicable to the shift register unit of any of the embodiments described above.

In step S101, a first input signal is applied to a first input signal terminal, a first clock signal is applied to a first clock signal terminal, and a second clock signal is applied to a second clock signal terminal, such that a first shift register may input a signal at the first input signal terminal to a pull-up node of the first shift register, and under control of potentials of the pull-up node, a first pull-down node and a second pull-down node of the first shift register, generate a first control output signal and a second control output signal based on a signal at the first clock signal terminal and provide the first control output signal and the second control output signal respectively to a first control output signal terminal and a second control output signal terminal, and generate a first output signal based on a signal at the second clock signal terminal and provide the first output signal to a first output signal terminal.

In step S102, a second input signal is applied to a second input signal terminal and a third clock signal is applied to a third clock signal terminal, such that a second shift register may transmit a signal at a second input signal terminal to a pull-up node of the second shift register, and under control of potentials of the pull-up node, a first pull-down node and a second pull-down node of the second shift register, generate a second output signal based on a signal of a third clock signal terminal and provide the second output signal to a second output signal terminal.

Figure 7:
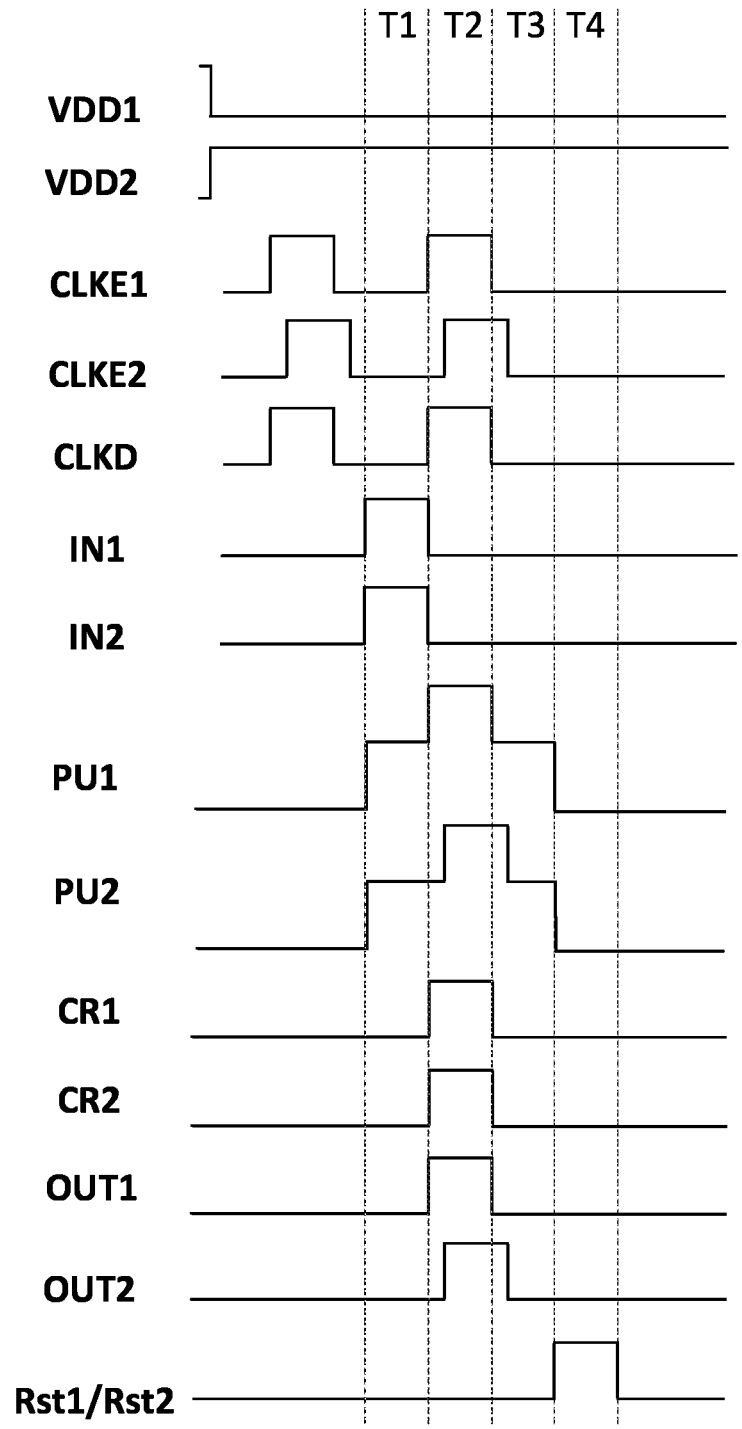
FIG. 7 shows a signal timing diagram of a shift register unit according to an embodiment of the present disclosure.

FIG. 7 shows a signal timing diagram of a shift register unit according to an embodiment of the present disclosure. The signal timing diagram is applicable to the shift register unit of any of the embodiments described above. The description will be given below in conjunction with the shift register structure shown in FIG. 3A and FIG. 3B.

As shown in FIG. 7, the first power supply signal terminal VDD1 and the second power supply signal terminal VDD2 are provided with power signals that are inverted from each other, so that the first control circuit 102 and the second control circuit 202 may operate alternately, so as to avoid a long-term forward bias of the transistor. As shown in FIG. 3A and FIG. 3B, the interconnection of the pull-down nodes of the first shift register 10 and the pull-down nodes of the second shift register 20 enables a normal generation of the output signal in a case that the first control circuit 102 and the second control circuit 202 operate alternately. This will be described below in detail with reference to the operation timing in FIG. 7.

In a period T1, the first input signal terminal IN1 is at a high level and the transistor M17 is turned on, so that the high level of the first input signal terminal IN1 is input to the pull-up node PU1, and the capacitor C1 starts to charge. The high level of the pull-up node PU1 may turn on the transistors M1, M2 and M11. At this time, because the first clock signal terminals CLKD and CLKE1 are both at a low level, each of the first control output signal terminal CR1, the second control output signal terminal CR2 and the first output signal terminal OUT1 may output a low level. In this period, the second input signal terminal IN2 is also at a high level and the transistor M19 is turned on, so that the pull-up node PU2 is at a high level and the transistor M12 is turned on. Similarly, because the third clock signal terminal CLKE2 is at a low level, the second output signal terminal OUT2 may also output a low level.

In this period, the high level of the pull-up node PU1 turns on the transistor M4, so that the first pull-down node PD1_1 is pulled down to a low level. Similarly, the high level of the pull-up node PU2 makes the first pull-down node PD2_1 at a low level. Therefore, the second pull-down node PD2_2 connected to the first pull-down node PD1_1 and the second pull-down node PD1_2 connected to the first pull-down node PD2_1 are also at a low level.

In a period T2, the first clock signal terminal CLKD is at a high level. At this time, because the transistors M1 and M2 are still in the ON state, the high level of the first clock signal terminal CLKD may be transmitted to the first control output signal terminal CR1 and the second control output signal terminal CR2. Similarly, because the second clock signal terminal CLKE1 is at a high level, the first output signal terminal OUT1 may also output a high level. Due to a bootstrap effect of the capacitor C1, the potential of the pull-up node PU1 is further increased. Based on a similar principle, the high level of the third clock signal terminal CLKE2 causes the second output signal terminal OUT2 to output a corresponding high level. In this embodiment, the clock signal at the third clock signal terminal CLKE2 is shifted with respect to the signal at the second clock signal terminal CLKE1, so that the output signal at the second output signal terminal OUT2 is shifted accordingly with respect to the first output signal terminal OUT1.

In a period T3, the first clock signal terminal CLKD and the second clock signal terminal CLKE1 both change to a low level, so that the first control output signal terminal CR1, the second control output signal terminal CR2 and the first output signal terminal OUT1 also change to a low level, and the potential of the pull-up node PU1 decreases accordingly. Based on a similar principle, the third clock signal terminal CLKE2 changes to a low level, so that the second output signal terminal OUT2 also changes to a low level.

In a period T4, the first reset signal terminal Rst1 and the second reset signal terminal Rst2 are at a high level. The high level of the first reset signal terminal Rst1 turns on the transistor M18, so that the pull-up node PU1 is reset to the low level of the reference signal terminal VGL1. Similarly, the high level of the second reset signal terminal Rst2 causes the pull-up node PU2 to be reset to a low level. At this time, because the first power signal terminal VDD1 is at a low level and the second power signal terminal VDD2 is at a high level, the first control circuit 102 does not operate, and the second control circuit 202 operates, so that the first pull-down node PD2_1 changes to a high level. The high level of the first pull-down node PD2_1 turns on the transistors M21 and M24, so that the second output signal terminal OUT2 and the pull-up node PU2 are pulled down to a low level. Because the first pull-down node PD2_1 is connected to the second pull-down node PD1_2 of the first shift register unit 10, the transistors M6, M8, M14 and M15 are all turned on, so that the first control output signal terminal CR1, the second control signal terminal CR2, the first output signal terminal OUT1 and the pull-up node PU1 are all pulled down to a low level.

Figure 8:
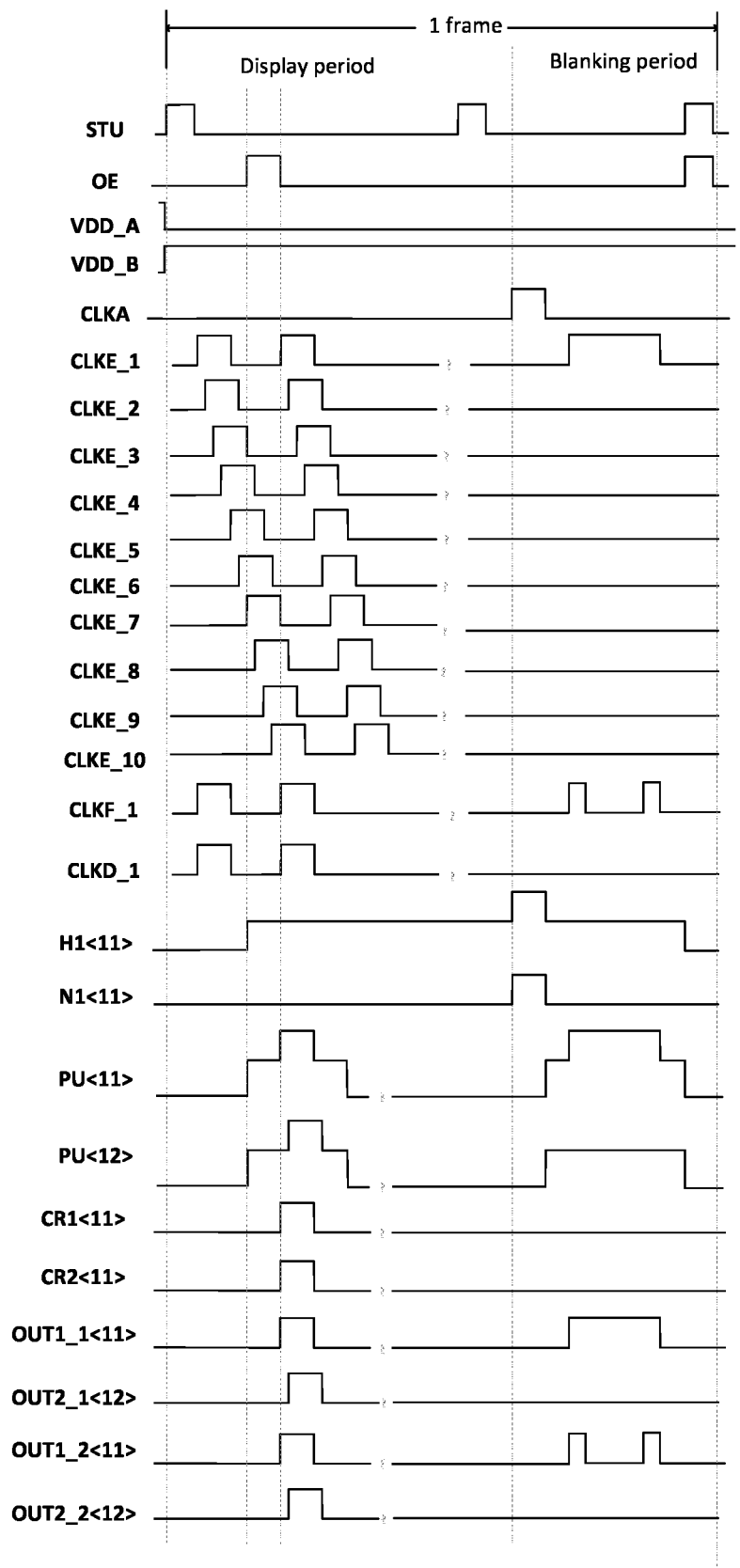
FIG. 8 shows a signal timing diagram of a gate driving circuit according to an embodiment of the present disclosure.

FIG. 8 shows a signal timing diagram of a gate driving circuit according to an embodiment of the present disclosure. This timing diagram is applicable to the gate driving circuit of any of the embodiments described above. In the following description, the gate driving circuit in FIGS. 5A/5B is illustrated by way of example. Assume that each shift register unit in FIGS. 5A/5B includes the first shift register shown in FIG. 4A and the second shift register shown in FIG. 4B.

As shown in FIG. 8, a frame includes a display period and a blanking period.

In the display period, each shift register unit operates in the manner described above, so as to generate output signals according to corresponding input signals and clock signals, thereby driving pixels on the display panel for display. For example, in the fifth stage of shift register unit Unit_5, the eleventh stage of shift register A11 may generate the first control signal CR1<11>, the second control signal CR2<11> and the output signals OUT1_1<11> and OUT1_2<11> based on the clock signals CLKD_1, CLKE_1 and CLKF_1, and the output terminals OUT1_1 and OUT1_2 of the twelfth stage of shift register A12 may output output signals OUT1_1<12> and OUT1_2<12>, respectively. In this period, as shown by the dotted line, the first control signal OE and the input signal at the first input signal terminal IN1 of the eleventh stage of shift register A11 are both at a high level, so that the transistor M30 in the eleventh stage of shift register A11 is turned on, then the high level of the first input signal terminal IN1 is transmitted to the node H1<11> and stored by the capacitor C4. In other words, this causes the fifth stage of shift register unit Unit_5 to be "selected" randomly.

In the blanking period, the randomly selected shift register unit (for example, the fifth stage of shift register unit Unit_5) may generate an output signal based on the corresponding clock signal, while the unselected shift register unit (for example, the fourth stage of shift register unit Unit_4) does not generate an output signal. As shown in FIG. 4A and FIG. 4B, because the eleventh stage of shift register A11 in the fifth stage of shift register unit Unit_5 previously stored a high level at the node H1<11>, when the high level of the second control signal CLKA arrives, the transistors M31 and M32 are turned on, so that the pull-up node PU1 (that is, PU<11>) changes to a high level, then the eleventh stage of shift register A11 may generate the corresponding output signal OUT1_1<11> and OUT1_2<11> according to the clock signals CLKE_1 and CLKF_1. The high level of the second control signal CLKA also turns on the transistor M40 in the twelfth stage of shift register A12, so that the pull-up node PU2 (that is, PU<12>) changes to a high level, then the twelfth stage of shift register A12 may generate corresponding output signals OUT2_1<12> and OUT2_2<12> according to the clock signals CLKE_2 and CLKF_2. Because the clock signals CLKE_2 and CLKF_2 are at a low level in the blanking period, the output signals OUT2_1<12> and OUT2_2<12> also remain at a low level.

Figure 9:
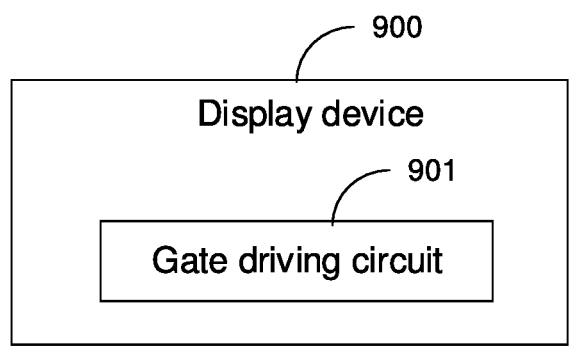
FIG. 9 shows a block diagram of a display device according to an embodiment of the present disclosure.

FIG. 9 shows a block diagram of a display device according to an embodiment of the present disclosure. As shown in FIG. 9, a display device 900 may include a gate driving circuit 901. The gate driving circuit 901 may be implemented by the gate driving circuit of any of the embodiments described above. Examples of the display device 900 include, but are not limited to a display screen, a mobile phone, a television, a tablet computer, a notebook, a desktop computer, and other devices with a display function. In some embodiments, the display device 900 may further include a display panel and a control circuit such as a source driver, a timing controller, and so on, which will not be repeated here.

Those skilled in the art may understand that the embodiments described above are exemplary, and those skilled in the art may make improvements. The structures described in the embodiments may be combined freely without conflicts in structure or principle.

After describing the preferred embodiments of the present disclosure in detail, those skilled in the art may clearly understand that various changes and modifications may be made without departing from the scope and spirit of the appended claims, and the present disclosure is not limited to implementations of the exemplary embodiments described in the present disclosure.

What is claimed is:

1. A gate driving circuit comprising N-stages of cascaded shift register units, each shift register unit comprising:
a first shift register comprising a pull-up node, a first pull-down node and a second pull-down node, wherein the first shift register is configured to: input a signal at a first input signal terminal to the pull-up node of the first shift register; and under control of potentials of the pull-up node, the first pull-down node and the second pull-down node of the first shift register, generate a first control output signal and a second control output signal based on a signal at a first clock signal terminal and provide the first control output signal and the second control output signal respectively to a first control output signal terminal and a second control output signal terminal, and generate a first output signal based on a signal at a second clock signal terminal and provide the first output signal to a first output signal terminal; and a second shift register comprising a pull-up node, a first pull-down node and a second pull-down node, wherein the second shift register is configured to: transmit a signal at a second input signal terminal to the pull-up node of the second shift register; and under control of potentials of the pull-up node, the first pull-down node and the second pull-down node of the second shift register, generate a second output signal based on a signal at a third clock signal terminal and provide the second output signal to a second output signal terminal;

wherein the first pull-down node of the first shift register is connected to the second pull-down node of the second shift register, and the second pull-down node of the first shift register is connected to the first pull-down node of the second shift register;

wherein the first shift register comprises: a first input circuit connected to the first input signal terminal and the pull-up node of the first shift register, wherein the first input circuit is configured to input the signal at the first input signal terminal to the pull-up node of the first shift register; a first control circuit connected to the pull-up node of the first shift register and the first pull-down node of the first shift register, wherein the first control circuit is configured to control the potential of the first pull-down node of the first shift register under control of the potential of the pull-up node of the first shift register; a first control output circuit connected to the pull-up node of the first shift register, the first clock signal terminal and the first control output signal terminal, wherein the first control output circuit is configured to generate a first control output signal based on the signal at the first clock signal terminal and provide the first control output signal to the first control output signal terminal, under control of the potential of the pull-up node of the first shift register; a second control output circuit connected to the pull-up node of the first shift register, the first clock signal terminal and the second control output signal terminal, wherein the second control output circuit is configured to generate a second control output signal based on the signal at the first clock signal terminal and provide the second control output signal to the second control output signal terminal, under control of the potential of the pull-up node of the first shift register; a first output circuit connected to the pull-up node of the first shift register, the second clock signal terminal and the first output signal terminal, wherein the first output circuit is configured to generate a first output signal based on the signal at the second clock signal terminal and provide the first output signal to the first output signal terminal, under control of the potential of the pull-up node of the first shift register; and a first pull-down circuit connected to the first pull-down node and the second pull-down node of the first shift register, the first control output signal terminal, the second control output signal terminal and the first output signal terminal, wherein the first pull-down circuit is configured to pull down a potential of the first control output signal terminal, a potential of the second control output signal terminal and a potential of the first output signal terminal, under control of the first pull-down node and the second pull-down node of the first shift register;

wherein the second shift register comprises: a second input circuit connected to the second input signal terminal and the pull-up node of the second shift register, wherein the second input circuit is configured to input the signal at the second input signal terminal to the pull-up node of the second shift register; a second control circuit connected to the pull-up node of the second shift register and the first pull-down node of the second shift register, wherein the second control circuit is configured to control the potential of the first pull-down node of the second shift register under control of the potential of the pull-up node of the second shift register; a second output circuit connected to the pull-up node of the second shift register, the third clock signal terminal and the second output signal terminal, wherein the second output circuit is configured to generate a second output signal based on the signal at the third clock signal terminal and provide the second output signal to the second output signal terminal, under control of the potential of the pull-up node of the second shift register; and a second pull-down circuit connected to the first pull-down node and the second pull-down node of the second shift register and the second output signal terminal, wherein the second pull-down circuit is configured to pull down a potential of the second output signal terminal under control of the first pull-down node and the second pull-down node of the second shift register;

wherein:

a first input signal terminal of a $n^{th}$ stage of shift register unit is connected to a first control output signal terminal of a $(n-2)^{th}$ stage of shift register unit, and a second input signal terminal of the $n^{th}$ stage of shift register unit is connected to a second control output signal terminal of the $(n-2)^{th}$ stage of shift register unit, where n is an integer greater than 1, and N is an integer greater than 1, 2<n<N-4; and a first reset signal terminal and a second reset signal terminal of the $n^{th}$ stage of shift register unit are connected to a first control output signal terminal or a second control output signal terminal of a $(n+4)^{th}$ stage of shift register unit; and wherein the first clock signal terminal of each stage of shift register unit is connected to receive a respective clock signal, such that the each stage of shift register unit generates a first control output signal and a second control output signal based on the respective clock signal.

2. A display device comprising the gate driving circuit of claim 1.

3. The gate driving circuit of claim 1, wherein:

the first control output circuit comprises a first transistor, and the first transistor has a gate electrode connected to the pull-up node of the first shift register, a first electrode connected to the first clock signal terminal and a second electrode connected to the first control output signal terminal; and the second control output circuit comprises a second transistor, and the second transistor has a gate electrode connected to the pull-up node of the first shift register, a first electrode connected to the first clock signal terminal and a second electrode connected to the second control output signal terminal.

4. The gate driving circuit of claim 1, wherein the first control circuit comprises:

a third transistor having a gate electrode and a first electrode connected to a first power signal terminal, and a second electrode connected to the first pull-down node of the first shift register; and a fourth transistor having a gate electrode connected to the pull-up node of the first shift register, a first electrode connected to a reference signal terminal, and a second electrode connected to the first pull-down node of the first shift register.

5. The gate driving circuit of claim 1, wherein the first pull-down circuit comprises:

a first pull-down sub-circuit connected to the first pull-down node and the second pull-down node of the first shift register and the first control output signal terminal, wherein the first pull-down sub-circuit is configured to pull down a potential of the first control output signal terminal under control of the first pull-down node and the second pull-down node of the first shift register;

a second pull-down sub-circuit connected to the first pull-down node and the second pull-down node of the first shift register and the second control output signal terminal, wherein the second pull-down sub-circuit is configured to pull down a potential of the second control output signal terminal under control of the first pull-down node and the second pull-down node of the first shift register; and a third pull-down sub-circuit connected to the first pull-down node and the second pull-down node of the first shift register and the first output signal terminal, wherein the third pull-down sub-circuit is configured to pull down a potential of the first output signal terminal under control of the first pull-down node and the second pull-down node of the first shift register.

6. The gate driving circuit of claim 5, wherein the first pull-down sub-circuit comprises:

a fifth transistor having a gate electrode connected to the first pull-down node of the first shift register, a first electrode connected to a reference signal terminal, and a second electrode connected to the first control output signal terminal; and a sixth transistor having a gate electrode connected to the second pull-down node of the first shift register, a first electrode connected to the reference signal terminal, and a second electrode connected to the first control output signal terminal.

7. The gate driving circuit of claim 5, wherein the second pull-down sub-circuit comprises:

a seventh transistor having a gate electrode connected to the first pull-down node of the first shift register, a first electrode connected to a reference signal terminal, and a second electrode connected to the second control output signal terminal; and an eighth transistor having a gate electrode connected to the second pull-down node of the first shift register, a first electrode connected to the reference signal terminal, and a second electrode connected to the second control output signal terminal.

8. The gate driving circuit of claim 1, wherein the second control circuit comprises:

a ninth transistor having a gate electrode and a first electrode connected to a second power signal terminal, and a second electrode connected to the first pull-down node of the second shift register; and a tenth transistor having a gate electrode connected to the pull-up node of the second shift register, a first electrode connected to a reference signal terminal, and a second electrode connected to the first pull-down node of the second shift register.

9. The gate driving circuit of claim 1, wherein the first output circuit comprises:
- an eleventh transistor having a gate electrode connected to the pull-up node of the first shift register, a first electrode connected to the second clock signal terminal, and a second electrode connected to the first output signal terminal; and
- a first capacitor having a first terminal connected to the pull-up node of the first shift register, and a second terminal connected to the first output signal terminal.

10. The gate driving circuit of claim 1, wherein the second output circuit comprises:
- a twelfth transistor having a gate electrode connected to the pull-up node of the second shift register, a first electrode connected to the third clock signal terminal, and a second electrode connected to the second output signal terminal; and
- a second capacitor having a first terminal connected to the pull-up node of the second shift register, and a second terminal connected to the second output signal terminal.

11. The gate driving circuit of claim 1, wherein the first shift register further comprises:
- a first reset circuit connected to a first reset signal terminal and the pull-up node of the first shift register, wherein the first reset circuit is configured to reset the pull-up node of the first shift register under control of a signal at the first reset signal terminal.

12. The gate driving circuit of claim 1, wherein the second shift register further comprises:
- a second reset circuit connected to a second reset signal terminal and the pull-up node of the second shift register, wherein the second reset circuit is configured to reset the pull-up node of the second shift register under control of a signal at the second reset signal terminal.

* * * * *